INVENTOR.
JOHN R. MAHONEY
BY
Norman N. Holland
ATTORNEY

Sept. 24, 1968 J. R. MAHONEY 3,402,561

REFRIGERATING APPARATUS

Filed March 21, 1967 2 Sheets-Sheet 2

INVENTOR.
JOHN R. MAHONEY
BY
Norman N. Holland
ATTORNEY 3,402,561
REFRIGERATING APPARATUS
John R. Mahoney, Norwood, N.J., assignor to Hoke Incorporated, Cresskill, N.J., a corporation of New Jersey
Filed Mar. 21, 1967, Ser. No. 624,809
14 Claims. (Cl. 62—3)

ABSTRACT OF THE DISCLOSURE

A cooler including a thermoelectric cooling means for reducing the temperature of a refrigeration chamber and having a thermally conductive barrier or shield included in the outer insulating layer for the cooling chamber with the barrier thermally coupled to portions of the thermoelectric cooling elements for providing improved cooling and more efficient operation.

The present invention relates to thermoelectric refrigerating means and more particularly to an improved thermoelectric refrigerating device having a heat conductive insert or barrier in the outer insulating layer of the refrigerator for reducing the refrigerator temperature and for increasing the efficiency of the thermoelectric cooling elements.

The thermoelectric refrigerators are in wide use particularly for relatively small or portable refrigerator devices. These refrigerators use thermoelectric elements as a refrigerating or heat pumping means. Such thermoelectric elements or modules consist of two opposed heat conductive layers mounted at the opposite ends of a group of thermoelectric junctions formed of semi-conducting material of alternately N-type and P-type. When direct current is passed through such an array, one face or module plate becomes cold and the other hot depending upon the direction of current flow. The improved refrigerating apparatus in accordance with the invention combines thermoelectric modules with a preferred insulating means including a heat conductive barrier embedded in the insulation for permitting greater cooling with a given module array and for increasing the operating efficiency of the module array.

Accordingly, an object of the present invention is to provide improved thermoelectric refrigerating apparatus.

Another object of the present invention is to provide thermoelectric cooling apparatus having an improved insulating or heat barrier means.

Another object of the present invention is to provide a thermoelectric refrigerating apparatus providing reduced temperatures with a given thermoelectric module array.

Another object of the present invention is to provide a thermoelectric refrigeration apparatus having the modules arranged for operating at conditions of higher efficiency.

Other and further objects of the invention will be obvious upon an understanding of the illustrative embodiment about to be described or will be indicated in the appended claims, and various advantages not referred to herein will occur to one skilled in the art upon employment of the invention in practice.

A preferred embodiment of the invention has been chosen for purposes of illustration and description and is shown in the accompanying drawings, forming a part of the specification, wherein.

Figures 1, 2, 3:
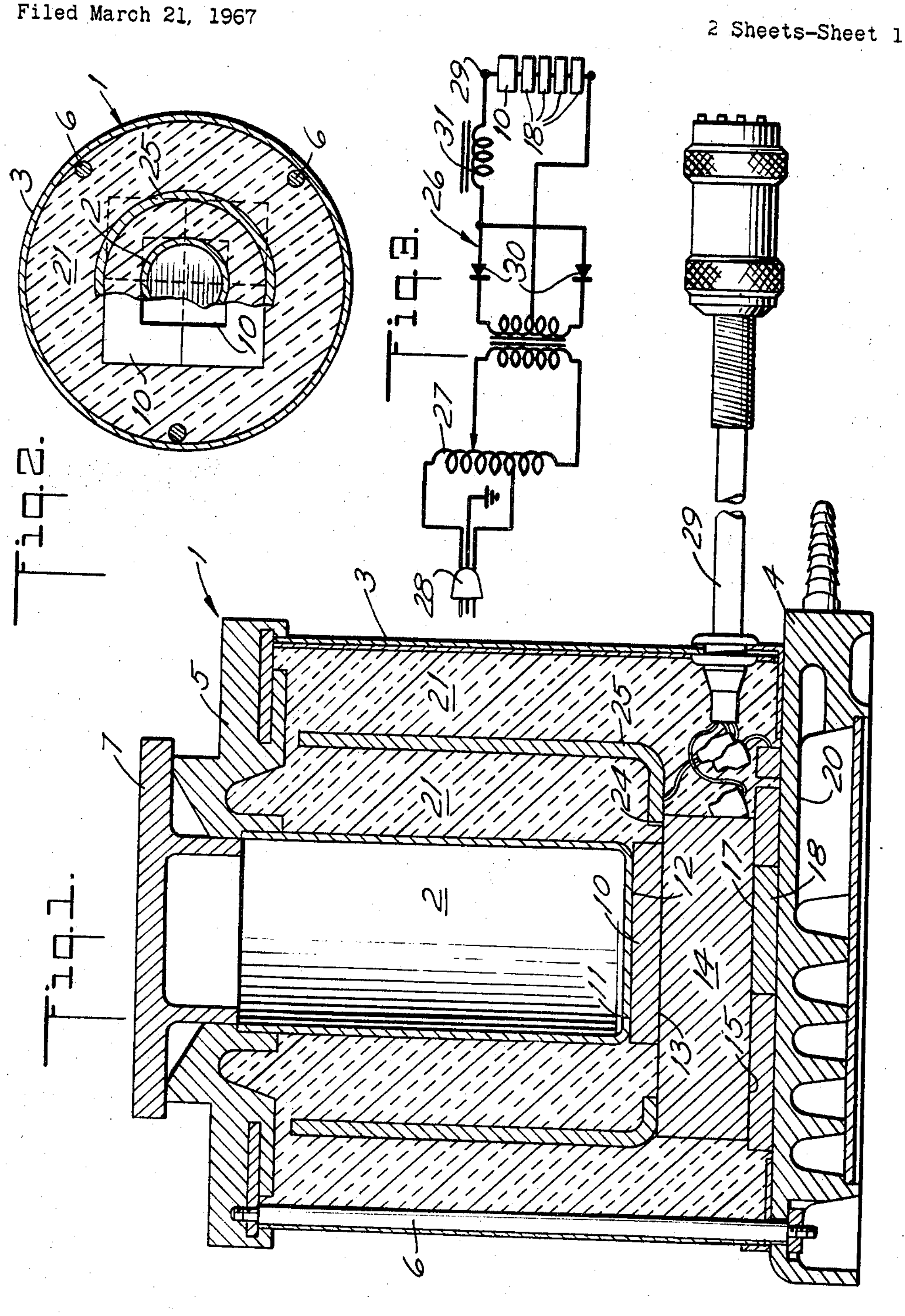
FIG. 1 is a vertical sectional view of the preferred embodiment of a thermoelectric refrigeration in accordance with the present invention.
FIG. 2 is a horizontal section of the apparatus of FIG. 1 on a reduced sacle.
FIG. 3 is a schematic diagram of a preferred embodiment of the electric power system.

The thermoelectric refrigerator will first be described generally with particular reference to FIGS. 1 and 2. The refrigerator 1 comprises a central cooling chamber 2 which may be an open ended water tight metal receptacle or similar element. The articles to be cooled are placed in this chamber with or without a liquid coolant. The chamber 2 is mounted in a cabinet or other container comprising an outer shell or housing 3 positioned between a base 4 and a top 5 conveniently held in engagement with the shell 3 by suitable connecting rods 6. The open top of the chamber 2 is sealed by a removable cover 7.

A thermoelectric module 10 is placed in heat transfer relationship with the cooling chamber 2 to remove heat from the chamber 2 by the above described thermoelectric action. These modules are commercially available in the various sizes and a conveniently proportioned module may be obtained to be mounted in heat transfer relationship with the bottom portion of the chamber 2 as illustrated with the cooling plate or surface 11 of the module 10 thermally coupled to the outer surface 12 of the cooling chamber 2. The opposite surface 13 or hot plate of the module 10 is placed in thermal engagement with a heat conducting element or heat sink 14 preferably made of copper or another material with excellent heat conductivity. The opposite or lower surface 15 on the heat sink 14 is placed in thermal conducting engagement with the cooling surfaces or plates 17 of an array of several thermoelectric modules 18 which in the embodiment illustrated comprises an array of four modules 18 as best illustrated in FIG. 2. The opposite surfaces 19 or hot plates of these modules are placed in thermal conducting engagement with the upper surface of the base 4 which includes a manifold 20 to permit coolant to be passed through the base.

A preferred manifold shape may be a spiral configuration with the fluid passing between the outer edge of the spiral and the center thereby assuring an efficient cooling action over the entire base and particularly the upper portion of the base 4 which is in contact with the modules 18. The space between the central cooling chamber 2 and the housing 3 and other members described above is filled with a foamed plastic 21 or other insulating material.

A heat conductive thermal barrier or guard element 25 is placed in this insulation in spaced relationship to both the chamber 2 and the shell 3 with its lower portion thermally connected at 24 to the heat sink 14 to provide improved refrigeration action as will be more fully described below.

The thermoelectric modules 10 and 18 used for the heat pumping or cooling action are coupled to a source of direct current as the passage of the current through the modules results in the cooling or pumping action. FIG. 3 illustrates a preferred circuit for providing the current. Since optimum cooling action for the modules is obtained at a predetermined current value, the circuit 26 preferably includes a control device such as an auto transformer 27 having its input 28 coupled to a conventional AC source and its output 29 coupled to a rectifier including diodes 30 and a choke 31 for providing a direct current output of the proper value with a filtering action preferably reducing the ripple in the DC output to the order of 10% or less.

With the five-module arrangement illustrated in FIG. 1, the four lower modules 18 operate to remove heat from the intermediate heat sink 14 as heat is pumped into the heat sink 14 from the chamber 2 by the upper module 10 and as heat flows into the sink from the thermal guard 25. In this cascaded module arrangement, the four lower modules 18 operate with a relatively high cold side temperature resulting in a more efficient heat pumping action with respect to the modules 18.

The action of the thermal guard 25 provides an improvement in both the low temperature obtainable in the chamber and also in the efficiency of the module operation. The thermal guard material is chosen to have a high thermal conductivity so that it maintains a substantially uniform temperature throughout by passing heat downwardly into the heat sink 14. In the absence of the thermal guard 25 heat flows from the ambient atmosphere through the insulation 21 to the cooling chamber and thence to the upper module 10. When the thermal guard 25 is inserted into the insulation 21 and is held at a fixed temperature approximately equal to that of the heat sink 14, a heat barrier results in the insulation 21 which diverts the heat flow toward the chamber and causes it to pass downwardly into the heat sink 14 and thence through the four lower modules 18 to the cooling base 4. Since the four lower modules are operating as already indicated with a higher cold side temperature, the heat sink 14 is able to handle in excess of four times the heat load as can the single module 10 without the heat barrier.

Figures 5, 6:
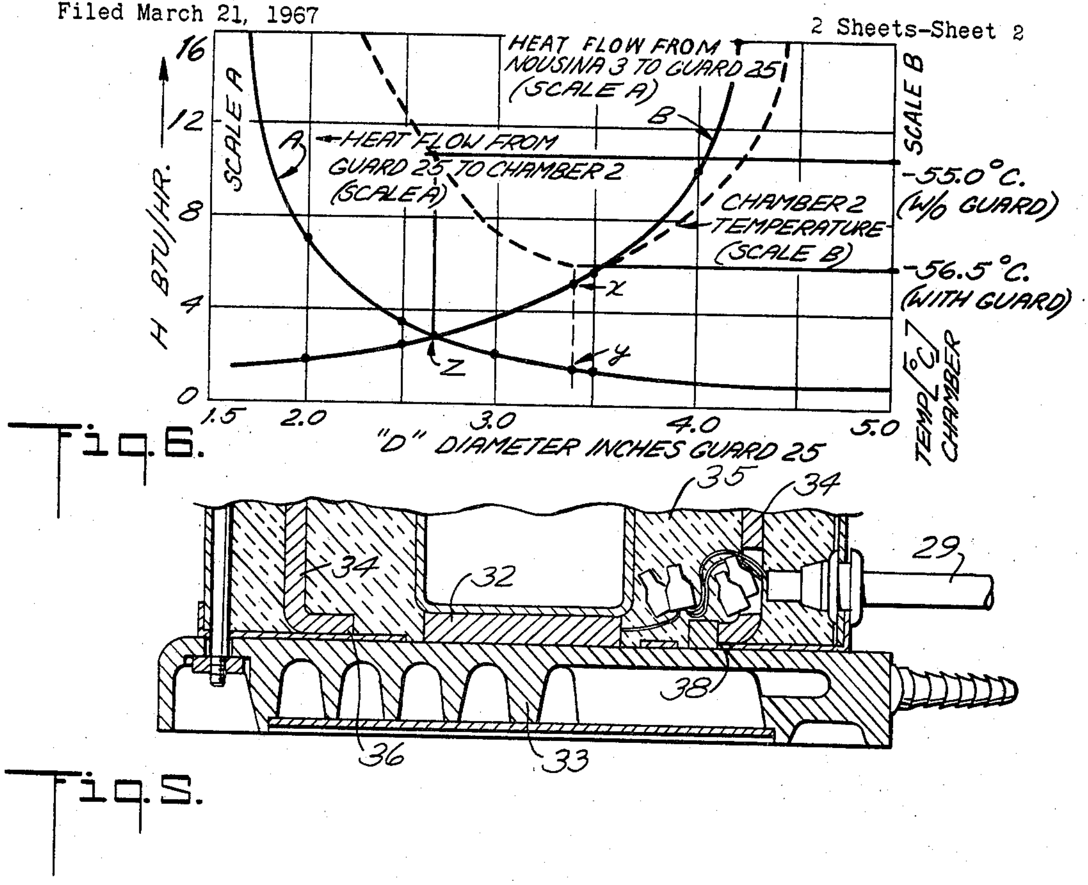
FIG. 5 is a vertical sectional view of another embodiment of a thermoelectric refrigerator in accordance with the present invention.
FIG. 6 is a graph illustrating the heat flow through the insulating means of a thermoelectric refrigerator in accordance with the present invention.
Figure 4:
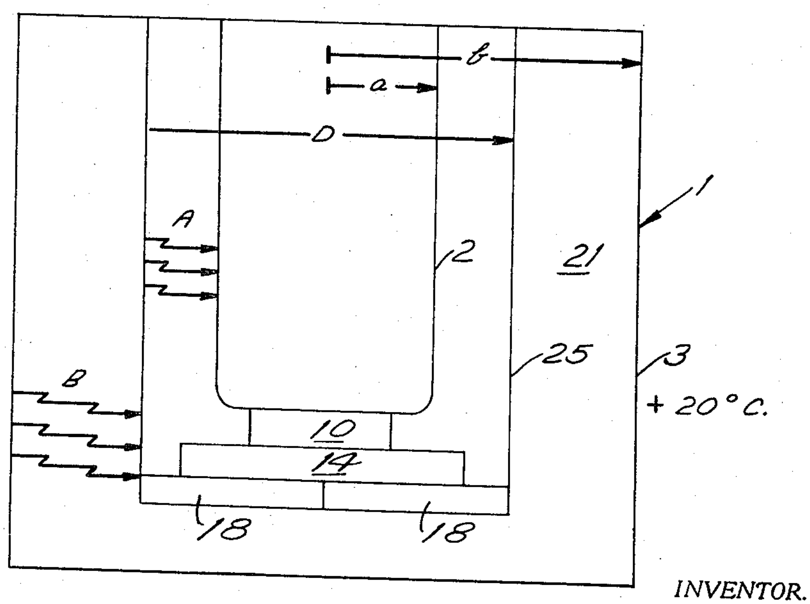
FIG. 4 is a diagrammatic view of a preferred embodiment of the thermoelectric apparatus illustrating the principle of the improved thermoelectric cooling arrangement.

This is a preferred positioning of the thermal barrier 25 in the insulation 21 which results in a maximum operating efficiency for the module array described above. This ideal positioning which will be further referred to with particular reference to FIGS. 4 and 6 is obtained when the thermal barrier 25 is positioned at such a point that the net effect of the heat flow from the outer housing 3 to the guard 25 and the heat flow from the guard 25 to the chamber 2 are such that the minimum chamber temperature is obtained as shown by the broken curve on FIG. 6. When the barrier 25 is positioned outwardly of this ideal diameter, the excess heat flow from the barrier 25 to the heat sink 14 degrades the operation of the lower modules 18 sufficiently to increase the chamber 2 temperature and when the barrier 25 is positioned inwardly of the ideal diameter, full advantage is not taken of the heat sink 14 and the lower array of modules 18.

The following illustration of the thermal guard action indicates the improved cooling for a thermal barrier positioned at about the ideal location.

The four modules 18 coupled thermally in parallel and to the thermal barrier 25 have an increased heat load of $x$–$z$ (FIG. 6) and the chamber 2 has a decreased heat load of $z$–$y$.

The total heat load of the four modules 18 with no guard 25 is:

$$Q_{18}=I_{10}^2R_{10}+Q_{10}$$

where:

$Q_{18}$=heat load of 4 modules 18
$I_{10}$=current through module 10
$R_{10}$=resistance of module 10
$Q_{10}$=heat load module 10

$$Q_{10}=\frac{2\pi LK\Delta t}{\ln b/a}=2.85\text{ B.t.u./hr. or .83 watts}$$

where:

$L$=chamber height
$K$=thermal conductivity=.15 B.t.u./hr./ft.$^2$/in./° F.
$\Delta t$=ambient temp.—chamber temp.=80° C.
ln=natural logarithm
$b$=radius housing 3
$a$=radius chamber 2

With a typical ideal module current of 6.2 amperes in a module of .286 ohm:

$$I_{10}^2R_{10}=11.1\text{ watts}$$
$$Q_{18}=11.1+.83=11.93\text{ watts}$$

The temperature differential across module 10 for a $Q_{10}$ of .83 watt and with the intermediate heat sink 14 at −25° C. is 30° C. The temperature across modules 18 for a $Q_{18}$ of 11.93 watts and with the base 4 temperature at 20° C. is 45° C.

Neglecting interface losses within the system, the overall temperature differential equals 30° C.+45° C.=75° C. The absolute temperature of the chamber 2 therefore is about 75° C. below ambient or 20° C.−75° C. or −55° C.

The following improvement becomes evident when the thermal guard 25 is placed into the system at a diameter corresponding to points $x$ and $y$ (FIG. 6) and is thermally tied to the intermediate heat sink 14.

$Q_{10}$ changes appreciably as a result of the reduced $\Delta T$ per inch of insulation between the guard 25 and the chamber. The heat is recalculated with the above formula with appropriate values for $a$ and $b$. $Q_{10}$ now becomes 1.76 B.t.u. or .484 watt as seen on plot A at point Y on FIG. 6.

Now:

$$Q_{18}=I_{10}^2R_{10}^2+Q_{10}+H_t$$

where:

$H_t$=heat load supplied by the thermal guard=$x-y$ (FIG. 6)=1.57−.484=1.086
$Q_{18}$=11.1+.484+1.086=12.67 watts The temperature across module 10 for a $Q_{10}$ of .484 watt and with the intermediate heat sink 14 at −24.7° C. is 31.85° C. The temperature differential across modules 18 for a $Q_{18}$ of 12.67 watts and with the base 4 temperature at 20° C. is 44.7° C.

Again neglecting interface losses within the system, the overall temperature differential equals $$31.85°\text{ C.}+44.7°\text{ C.}=76.55°\text{ C.}$$

The absolute temperature of the chamber 2 therefore is about 76.55° C. below ambient or 20° C.−76.55° C. or −56.55° C.

A net gain for the system temperature differential is realized in excess of 1° C. The heat load on the chamber was reduced by about 42% while the increased heat load on the base modules from the thermal guard was only about 6%.

The theory of the thermal guard may be applied in thermoelectric systems of differing arrangements with corresponding improvements. FIG. 5 shows another embodiment where the heat removing capacity of the modules 18 is replaced by a direct thermal transfer from a module 32 to a water cooled sink and base 33. In this embodiment, the thermal guard 34 in the insulation 35 is thermally coupled at 36 to the top of the base 33.

The concept of staged heat sinks and modules may be extended to add additional stages with heat guards connected to the additional stages.

Where additional modules such as 8 modules are placed in two stages and are substituted for the four modules 18 in the above described embodiment, a correspondingly greater temperature reduction is obtained. In general, when the heat load on the coldest module in a system is appreciable as compared to that modules ultimate heat pumping capacity, many degrees improvement can be obtained.

It will be seen that an improved thermoelectric refrigerating means has been described where reduced temperatures are obtained with minor additions to the thermoelectric elements and energy expenditure. The improvements are obtained with relatively minor physical changes in the refrigerator system which require little or no change in the overall size of typical units. In particular reduced refrigerating temperatures are obtainable from the novel system improvements described.

As various changes may be made in the form, construction and arrangement of the parts herein without departing from the spirit and scope of the invention and without sacrificing any of its advantages, it is to be understood that all matter herein is to be interpreted as illustrative and not in a limiting sense.

Having thus described my invention, I claim:

1. Thermoelectric apparatus comprising the combination of a means to be cooled, thermoelectric means connected in thermal exchange relationship with said cooled means, heat exchange means coupled to said thermoelectric means, insulating means for said cooled means, and a heat conducting guard means positioned in said insulation and spaced from said cooled means and thermally coupled to said heat exchange means.

2. The apparatus as claimed in claim 1 in which said heat exchange means comprises a second thermoelectric means, and a cooling means for said second thermoelectric means.

3. The apparatus as claimed in claim 1 in which said heat exchange means comprises a second thermoelectric means, a heat sink thermally coupled thereto, and a cooling means for said heat sink.

4. The apparatus as claimed in claim 1 in which said guard means is positioned for receiving a greater heat flow from the ambient atmosphere than the heat flow from the guard to the cooled means.

5. Thermoelectric apparatus comprising the combination of a means to be cooled, first thermoelectric cooling means connected in thermal cooling exchange relationship with said cooled means, second thermoelectric cooling means of greater cooling capacity than said first cooling means connected in thermal cooling exchange relationship with said first cooling means, heat transfer means thermally coupled to said second thermoelectric cooling means, insulating means for said cooled means, and a heat conducting guard means positioned in said insulation and spaced from said cooled means and thermally coupled to said second cooling means.

6. The apparatus as claimed in claim 5 in which said guard is positioned for receiving a heat flow from the ambient atmosphere greater than the heat flow from the guard to the cooled means.

7. The apparatus as claimed in claim 5 in which said guard is positioned for receiving a heat flow from the ambient atmosphere greater than the heat flow from the guard to the cooled means, and said second cooling means has a heat pumping capacity greater than that of the first cooling means by a correspondingly greater capacity.

8. Thermoelectric apparatus comprising the combination of a means to be cooled, first thermoelectric cooling means connected in thermal cooling exchange relationship with said first cooled means, a heat sink coupled in thermal exchange relationship with said cooling means, second thermoelectric cooling means connected in thermal cooling exchange relationship with said heat sink, heat transfer means thermally coupled to said second thermoelectric cooling means, insulating means for said cooled means, and a heat conducting guard means positioned in said insulation and spaced from said cooled means and thermally coupled to said heat sink.

9. The apparatus as claimed in claim 8 in which said guard is positioned for receiving a heat flow from the ambient atmosphere greater than the heat flow from the guard to the cooled means, and said second cooling means has a heat pumping capacity greater than that of the first cooling means by a correspondingly greater capacity.

10. The apparatus as claimed in claim 8 in which said guard is positioned for reducing the heat flow to said cooled means.

11. Thermoelectric apparatus comprising the combination of a means to be cooled, thermoelectric means having its cold side connected in thermal exchange relationship with said cooled means, heat exchange means thermally coupled to the hot side of said thermoelectric means, insulating means for said cooled means, and a heat conducting guard means positioned in said insulation and spaced from said cooled means and thermally coupled to said heat exchange means.

12. The apparatus as claimed in claim 11 in which said guard is positioned for reducing the heat flow to said cooled means.

13. Thermoelectric apparatus comprising the combination of a means to be cooled, first thermoelectric cooling means having its cold side connected in thermal cooling exchange relationship with said cooled means, second thermoelectric cooling means of greater cooling capacity than said first cooling means having its cold side connected in thermal cooling exchange relationship with the hot side of said first cooling means, heat transfer means thermally coupled to the hot side of said second thermoelectric cooling means, insulating means for said cooled means, and a heat conducting guard means positioned in said insulation and spaced from said cooled means and thermally coupled to said second cooling means.

14. The apparatus as claimed in claim 13 in which said guard is positioned for reducing the heat flow to said cooled means.

References Cited

UNITED STATES PATENTS

| | | | |
|---|---|---|---|
| 2,978,875 | 4/1961 | Lackey | 62—3 |
| 3,018,631 | 1/1962 | Bury | 62—3 |
| 3,332,807 | 7/1967 | Boehmer | 62—3 |

WILLIAM J. WYE, *Primary Examiner.*